(12) United States Patent
Liu et al.

(10) Patent No.: US 9,564,398 B2
(45) Date of Patent: Feb. 7, 2017

(54) CHEMICAL DIRECT PATTERN PLATING INTERCONNECT METALLIZATION AND METAL STRUCTURE PRODUCED BY THE SAME

(71) Applicant: Taiwan Semiconductor Manufacturing Co., Ltd., Hsin-Chu (TW)

(72) Inventors: Wen-Jiun Liu, Zhunan Township (TW); Chen-Yuan Kao, Zhudong Township (TW); Hung-Wen Su, Jhubei (TW); Mingh-Hsing Tsai, Chu-Pei (TW); Syun-Ming Jang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/832,195

(22) Filed: Mar. 15, 2013

(65) Prior Publication Data
US 2014/0264866 A1     Sep. 18, 2014

Related U.S. Application Data

(60) Provisional application No. 61/777,222, filed on Mar. 12, 2013.

(51) Int. Cl.
*H01L 23/532* (2006.01)
*H01L 21/768* (2006.01)
(Continued)

(52) U.S. Cl.
CPC ....... *H01L 23/53238* (2013.01); *H01L 21/288* (2013.01); *H01L 21/76834* (2013.01);
(Continued)

(58) Field of Classification Search
CPC ............. H01L 21/4885; H01L 23/48; H01L 23/49827; H01L 21/312; H01L 23/53238; H01L 23/49822; H01L 23/5283; H01L 21/76885; H01L 21/288; H01L 21/76834; H01L 21/76852; H01L 23/522
(Continued)

(56) References Cited

U.S. PATENT DOCUMENTS 6,117,784 A     9/2000  Uzoh
6,555,908 B1 *  4/2003  Eichelberger et al. ....... 257/737
(Continued)

FOREIGN PATENT DOCUMENTS

DE   10 2008 048 424 A1    5/2009
JP      2004-221334         8/2004
(Continued)

OTHER PUBLICATIONS

Official Action issued Apr. 8, 2014 in counterpart KR Patent Application No. 10-2013-0071148.
(Continued)

*Primary Examiner* — Latanya N Crawford
(74) *Attorney, Agent, or Firm* — Duane Morris LLP

(57) ABSTRACT

A semiconductor structure with an improved metal structure is described. The semiconductor structure can include a substrate having an upper surface, an interconnect layer over the upper surface, and an additional structure deposited over the interconnect layer. The interconnect layer can include a patterned seed layer over the substrate, at least two metal lines over the seed layer, and a dielectric material between adjacent metal lines. A barrier layer can be deposited over the at least two metal lines. Methods of making the semiconductor structures are also described.

19 Claims, 9 Drawing Sheets

(51) Int. Cl.
*H01L 23/528* (2006.01)
*H01L 21/288* (2006.01)
*H01L 23/522* (2006.01)

(52) U.S. Cl.
CPC .. *H01L 21/76852* (2013.01); *H01L 21/76885* (2013.01); *H01L 23/5283* (2013.01); *H01L 23/522* (2013.01); *H01L 2924/0002* (2013.01)

(58) Field of Classification Search
USPC .................. 257/737, 738, E23.021, E23.02, E23.024,257/E23.023, 700
See application file for complete search history.

(56) References Cited

U.S. PATENT DOCUMENTS

| | | | |
|---|---|---|---|
| 7,312,146 B2 | 12/2007 | Cheung et al. | |
| 8,361,598 B2* | 1/2013 | Daubenspeck | H01L 21/563 174/259 |
| 8,445,990 B2* | 5/2013 | Lin et al. | 257/531 |
| 8,462,516 B2* | 6/2013 | Wong | B81C 1/00095 174/254 |
| 8,701,281 B2* | 4/2014 | Sidhu | H05K 3/3489 174/255 |
| 2003/0003701 A1 | 1/2003 | Subramanian et al. | |
| 2003/0054633 A1 | 3/2003 | Lee et al. | |
| 2004/0060174 A1* | 4/2004 | Imafuji | H01L 21/4857 29/831 |
| 2004/0185683 A1 | 9/2004 | Nakamura | |
| 2004/0203235 A1 | 10/2004 | Miyakawa | |
| 2005/0200013 A1* | 9/2005 | Ho | 257/737 |
| 2006/0238207 A1* | 10/2006 | Egitto | G01R 1/06711 324/754.18 |
| 2007/0164445 A1* | 7/2007 | Ejima | 257/777 |
| 2008/0079150 A1* | 4/2008 | Simon | H01L 23/3114 257/737 |
| 2008/0122078 A1* | 5/2008 | He et al. | 257/737 |
| 2008/0128885 A1* | 6/2008 | Lee et al. | 257/690 |
| 2008/0258299 A1* | 10/2008 | Kang | H01L 24/83 257/737 |
| 2009/0102032 A1 | 4/2009 | Schneegans et al. | |
| 2009/0110881 A1* | 4/2009 | Daubenspeck et al. | 428/138 |
| 2009/0243100 A1* | 10/2009 | Akiyama | H01L 23/481 257/738 |
| 2009/0243104 A1* | 10/2009 | Lee | 257/751 |
| 2009/0261466 A1* | 10/2009 | Pagaila | H01L 21/6835 257/686 |
| 2010/0140760 A1* | 6/2010 | Tam et al. | 257/660 |
| 2011/0223765 A1* | 9/2011 | Rajagopalan | C23C 16/345 438/694 |
| 2012/0043672 A1* | 2/2012 | Cho et al. | 257/778 |
| 2012/0056321 A1* | 3/2012 | Pagaila | 257/737 |
| 2012/0153467 A1* | 6/2012 | Chi et al. | 257/737 |
| 2012/0164829 A1* | 6/2012 | Rajagopalan | H01L 21/02074 438/675 |
| 2012/0175784 A1* | 7/2012 | Lin et al. | 257/774 |
| 2012/0199972 A1* | 8/2012 | Pagaila | H01L 21/6835 257/737 |
| 2012/0223429 A1* | 9/2012 | Khan et al. | 257/738 |
| 2013/0037936 A1* | 2/2013 | Choi et al. | 257/737 |
| 2013/0134581 A1* | 5/2013 | Lin et al. | 257/737 |
| 2014/0167254 A1* | 6/2014 | Yu et al. | 257/737 |

FOREIGN PATENT DOCUMENTS

| | | |
|---|---|---|
| KR | 2004-0058950 | 7/2004 |
| KR | 10-20120130636 A | 5/2014 |

OTHER PUBLICATIONS

Meen, T.H. et al., "Thin Copper Seed Layers in Interconnect Metallization Using the Electroless Plating Process", Jpn. J. Appl. Phys., 2004, 43:5100-5104.

Shi, P. et al., "Direct Copper Electrodeposition on a Chemical Vapor-Deposited Ruthenium Seed Layer for Through-Silicon Vias", 2012 IEEE International Interconnect Technology Conference (IITC), Jun. 2012, 3 pages.

Official Action issued Jan. 27, 2014 in counterpart German Patent Application No. 10 2013 105 722.5.

Official Action issued Oct. 27, 2014 in counterpart KR Patent Application No. 10-2013-0071148.

\* cited by examiner

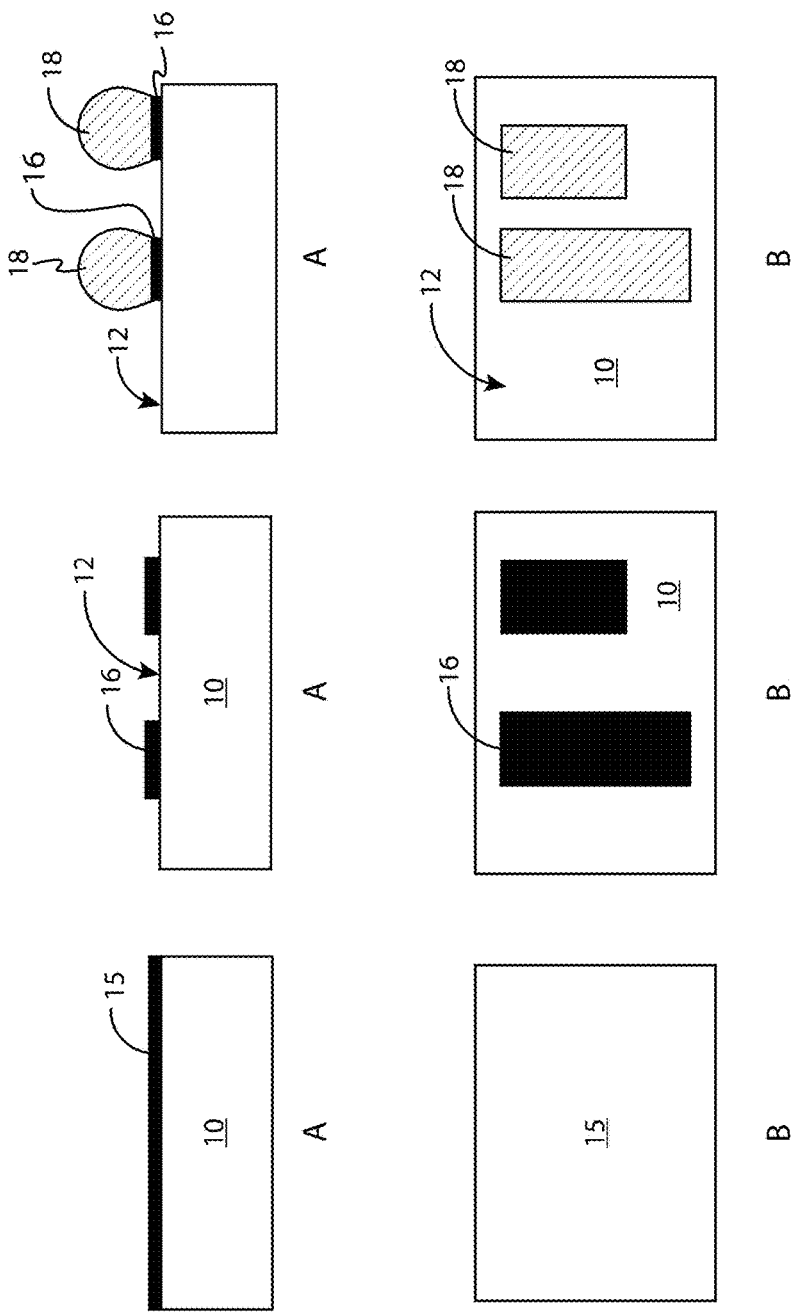

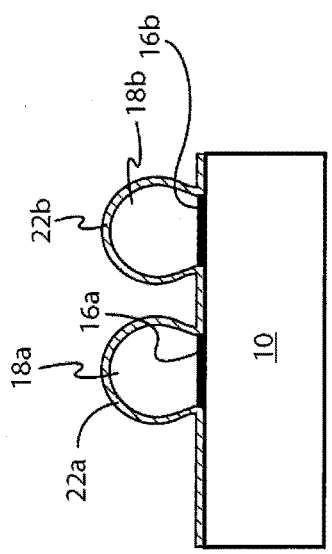
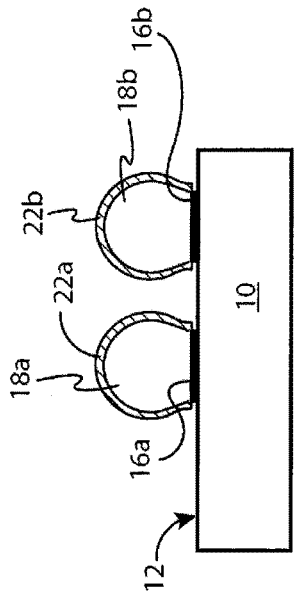
FIG. 6
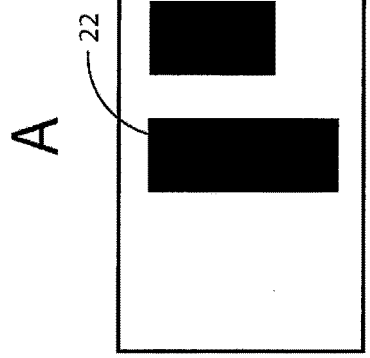
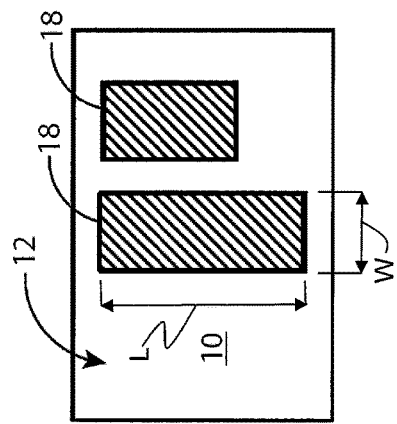
FIG. 7
FIG. 7A

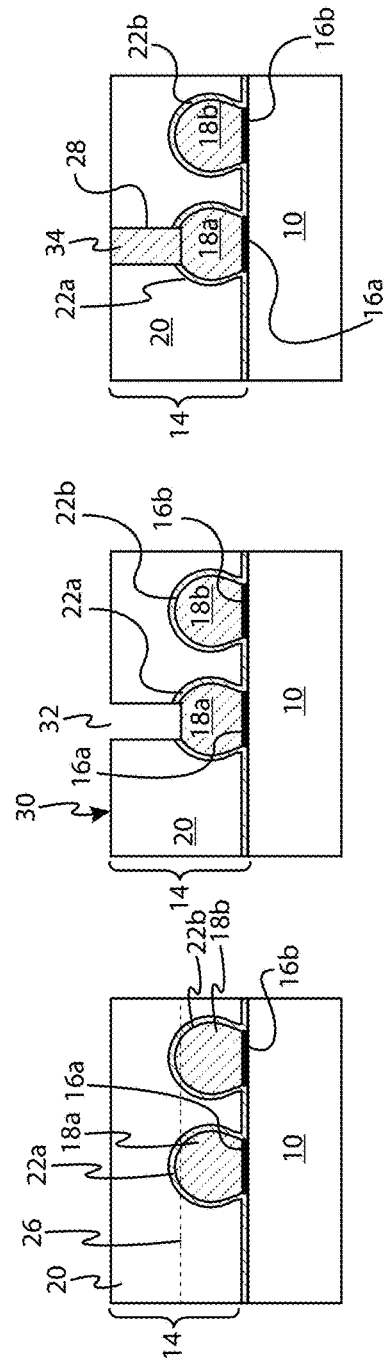

CHEMICAL DIRECT PATTERN PLATING INTERCONNECT METALLIZATION AND METAL STRUCTURE PRODUCED BY THE SAME

CROSS-REFERENCE TO RELATED APPLICATIONS

This application claims priority to U.S. Provisional Application No. 61/777,222, for "Chemical Direct Pattern Plating Interconnect Metallization and Metal Structure Produced by the Same," filed Mar. 12, 2013, the entirety of which is incorporated by reference herein.

BACKGROUND

In important aspect of semiconductor structures, such as integrated circuits, is the ability to interconnect various components both on the same layer and in different layers of the integrated circuit. As integrated circuits and other semiconductor structures get smaller, the size of the relevant interconnects also decreases. Conventional interconnect deposition techniques include damascene processes of patterning the interconnect within another structure, such as a dielectric. The damascene process has been used for hundreds of years to produce jewelry and various other ornamental objects. However, with the continued reduction of integrated circuit size it becomes more difficult to utilize conventional techniques for forming interconnects and vertical interconnect accesses ("vias"), especially when high-aspect ratio structures are involved. This significantly limits the ability to continue using conventional interconnect deposition techniques.

BRIEF DESCRIPTION OF THE DRAWING

The present disclosure is best understood from the following detailed description when read in conjunction with the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIGS. 2A and 2B are cross-sectional and top views, respectively, of an intermediate structure following formation of a seed layer in accordance with some embodiments.

FIGS. 3A and 3B are cross-sectional and top views, respectively, of an intermediate structure following formation of a patterned seed layer in accordance with some embodiments.

FIGS. 4A and 4B are cross-sectional and top views, respectively, of an intermediate structure following formation of a metal line over the seed layer in accordance with some embodiments.

FIGS. 6A and 6B are cross-sectional and top views, respectively, of an intermediate structure following deposition of a barrier layer on a metal line in accordance with some embodiments.

FIG. 7 is a cross-sectional view of the intermediate structure of FIG. 6 following removal of the barrier layer between adjacent metal lines in accordance with some embodiments. FIG. 7A is a top view of the structure of FIG. 7.

FIG. 8 is a cross-sectional view of the intermediate structure of FIG. 6 following deposition of a dielectric layer between and over the metal lines in accordance with some embodiments.

FIG. 9 is a cross-sectional view of the intermediate structure of FIG. 8 following formation of a channel in the dielectric layer in accordance with some embodiments.

FIG. 10 is a cross-sectional view of the intermediate structure of FIG. 9 following filling of the channel with a metal to form a via in accordance with some embodiments.

DETAILED DESCRIPTION

The disclosure provides for forming metal structures, such as interconnects and vertical interconnect accesses ("vias") in MOS devices, such as metal-oxide-semiconductor field-effect transistors (MOSFETs) and integrated circuits. As device sizes decrease, the ability to deposit uniform conductive (e.g., metal) lines in vias or trenches in dielectric layers using single and/or dual damascene processes is complicated. The disclosure provides methods for depositing first and second metal lines over the surface of the substrate prior to, depositing the dielectric layer that covers the conductive lines. An overview of the method used to form various metal structures according to the disclosure is provided in FIG. 1. Further details of the method and structures formed according to the methods are provided in conjunction with the subsequent figures.

Figure 1:
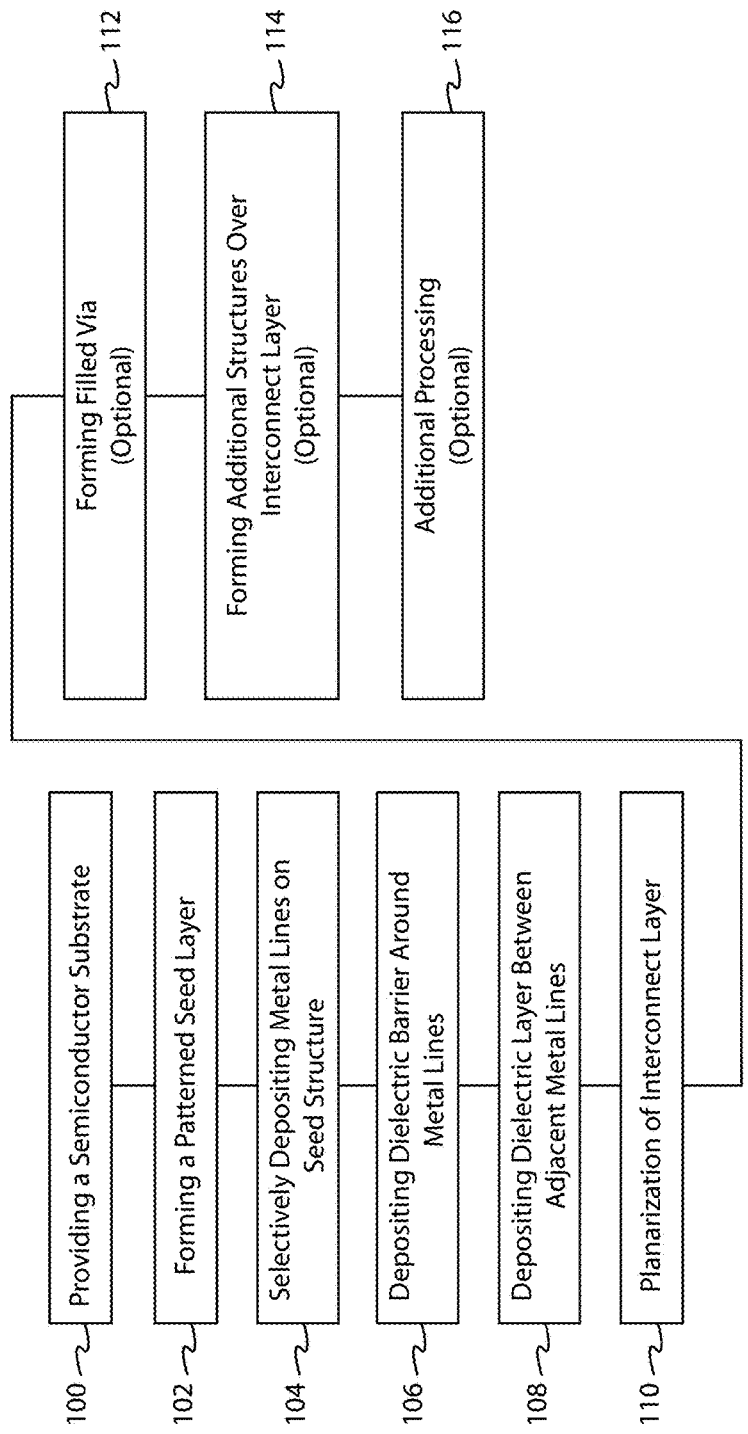
FIG. 1 is a flowchart for forming a metal structure in accordance with some embodiments.

FIG. 1 is a flowchart describing a broad method for carrying out the formation of a metal interconnect or via in accordance with some embodiments. At step 100, a semiconductor substrate is provided. The semiconductor substrate can be silicon, such as crystalline silicon, silicon on insulator (SOI), or another suitable semiconductor material. In some embodiments, the semiconductor substrate can be a structured substrate, having one or more devices in the active-device layers, such as a MOSFET, diode, capacitor or the like.

Step 102 provides for the formation of a patterned seed layer over or on the substrate. Step 104 provides for depositing a metal line over the seed structure. In some embodiments, step 106 provides for an optional step of depositing a barrier layer around the metal line. Step 108 provides for depositing a dielectric layer between adjacent metal lines, i.e., filling the space between adjacent, spaced-apart metal lines (such as first and second metal lines) with a dielectric layer. Step 110 provides for planarization of the interconnect layer, e.g., chemical mechanical polishing. Step 112 provides for an optional step of forming a filled via from the surface of the interconnect layer to the metal line. Step 114 provides for forming additional structures over or on the interconnect layer. Step 116 provides for additional processing. Examples of additional processing steps can include, but are not limited to, deposition of a dielectric layer, additional etching and polishing steps, deposition of additional circuitry and the like.

The method for forming a metal interconnect or via can include providing a substrate 10 having an upper surface 12, and forming an interconnect layer 14 over or on the upper surface 12. The method of forming the interconnect layer 14 can include forming a patterned seed layer 16 with multiple features (e.g., 16a, 16b) over or on the upper surface 12, selectively depositing a metal line 18 over the seed layer 16, and depositing a dielectric layer 20 between adjacent metal lines 18 (e.g., first and second metal lines 18a, 18b). The dielectric layer 20 can be formed from a dielectric material, a low-κ material, or an extreme low-κ material. As used herein, the phrase "low-κ" refers to a material having a dielectric constant less than silicon, while the phrase "extreme low-k (ELK)" refers to a material having a low dielectric constant of approximately 2.6 or less. Some ELK materials can have a dielectric constant ranging from approximately 2.4 to approximately 2.6. As used herein, "features" of the patterned seed layer, refer to discrete, separate parts of the seed layer.

In FIGS. 2-4 & 6, the A-series (FIGS. 2A, 3A, 4A & 6A) is a cross-sectional view of the relevant substructure, while the B-series (FIGS. 2B, 3B, 4B & 6B) is a top plan view of the relevant substructure. FIGS. 2 & 3 show one embodiment of forming a patterned seed layer 16. As shown in FIG. 2, a base seed layer 15 can be deposited over or on the planar upper surface 12 of the substrate 10. Portions of the base seed layer 15 can be removed to form the patterned seed layer 16, as seen in FIG. 3. In such an embodiment, the portions of the base seed layer 15 can be removed using lithography and selective etching. Alternately, the patterned seed layer 16 can be applied directly without the intermediate step shown in FIG. 2. In some embodiments, a thickness of the patterned seed layer 16 can be 1-100 Å and can be 3-50 Å in other embodiments. As used herein, "over" is intended to include both "directly on" and "above, but not directly on."

The seed layer 15, 16 can be a conductivity layer to facilitate electron transfer during formation of the metal line(s) 18. The metal line(s) (18) can be deposited over the patterned seed layer 16 by direct chemical plating in some embodiments or any suitable method in other embodiments. The seed layer 15, 16 can include an element such as, but not limited to, Cu, Ru, Co, Al, Fe, Mn, Zn, W, Sn, Ag Au, Pt, Ta, Ti, and combinations thereof. The seed layer 15, 16 can include a composition such as, but not limited to, RuO, RuTa, RuTi, CoO, MnO, CuCo, RuCu, TaCu, or combinations thereof.

FIGS. 4A and B show view of the structure of FIG. 3 after the metal line 18 is deposited over the patterned seed layer 16. The metal line 18 can be formed from a metal including, but not limited to, copper (Cu), gold (Au), silver (Ag), nickel (Ni), rhodium (Rh), chromium (Cr), zinc (Zn), tin (Sn), Cadmium (Cd), tungsten (W), aluminum (Al), titanium (Ti), ruthenium (Ru), tantalum (Ta), cobalt (Co), and combinations thereof.

In some embodiments, a height (H) of the metal line can be 10-1000 Å or 50-500 Å.

Figure 5:
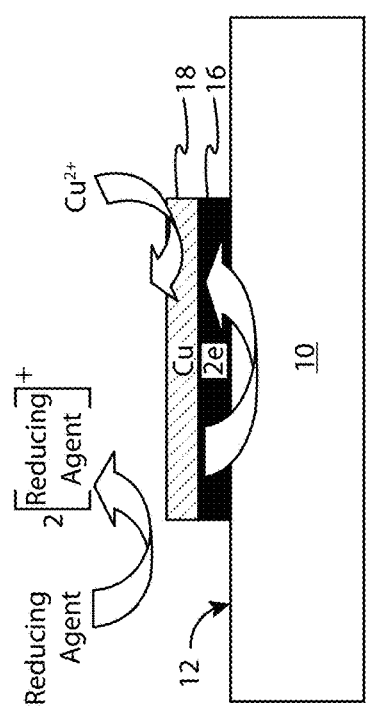
FIG. 5 is a cross-sectional schematic showing how a copper line can be deposited over a seed layer in accordance with some embodiments.
Figure 15:
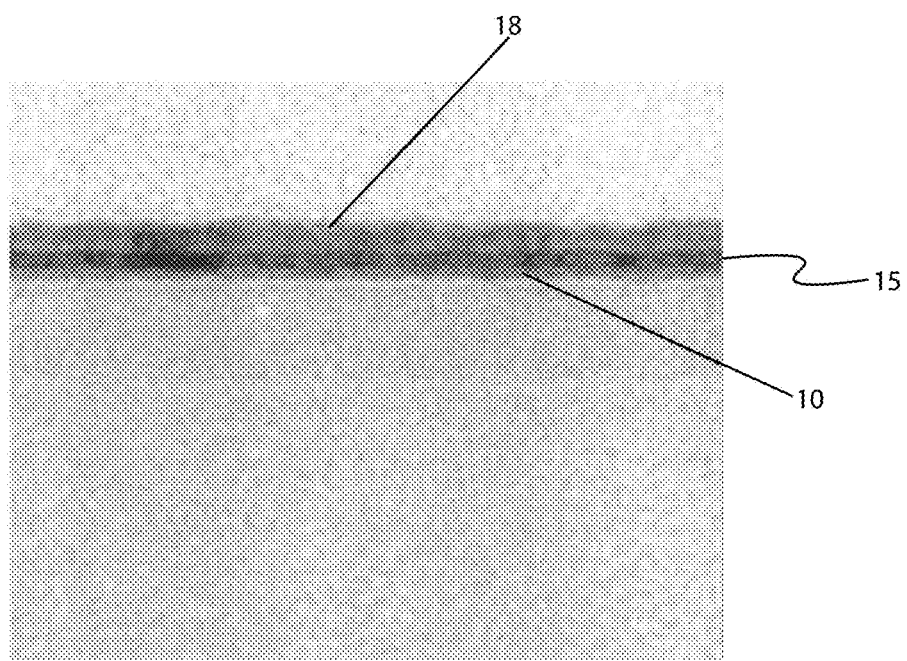
FIG. 15 is a cross-sectional view of a structure where a metal layer was deposited over a seed layer deposited over a silicon substrate.

The metal line 18 can be formed by a redox deposition technique in some embodiments. The redox deposition technique can be direct chemical plating in some embodiments and any suitable technique in other embodiments. FIG. 5 shows a schematic of a redox deposition technique for the deposition of a copper line. As shown in FIG. 5, the structure of FIG. 3 is exposed to a solution containing both copper cations ($Cu^{2+}$) and a reducing agent, which results in deposition of copper on the patterned seed layer 16 and oxidation of the reducing agent. Examples of suitable reducing agents include, but are not limited to, hypophosphite ($H_2PO_2^-$), sodium borohydride ($NaBH_4$) and mixtures thereof. The metal line 18 can include contaminants, such as boron or phosphorous, as a result of the direct chemical plating process. FIG. 15 shows a cross-section of a structure where a copper layer 18 was deposited on a ruthenium seed layer 15, which was deposited on a silicon substrate 10.

As shown in FIG. 6, a barrier layer 22 can be formed around the metal line 18. The barrier layer 22 can be formed of a material that acts as a barrier to diffusion of an element (e.g., a metal) present in the metal line 18 into the surrounding dielectric material 20 (FIG. 8). The barrier layer 22 can also enhance adhesion between the metal line 18 and the dielectric layer 20. As seen in FIG. 6, the first metal line 16a, the second metal line 16b, or both 16a, 16b can have rounded top surfaces. In some embodiments, the first metal line 16a, the second metal line 16b, or both 16a, 16b can have rounded top surfaces along portions thereof or along the entirety thereof.

As shown in FIG. 7, in some embodiments the barrier layer 22a, 22b is not continuous between first and second metal lines 18a & 18b, which can be adjacent metal lines. Where the barrier layer 22a, 22b is not continuous as shown in FIG. 6, it is possible for the barrier layer 22a, 22b to be either conductive or non-conductive without forming a short-circuit between first and second metal lines 18a, 18b. However, if the barrier layer 22a, 22b comprises a conductive material, then the barrier layer 22a, 22b must be discontinuous as shown in FIG. 7, so as to avoid forming a short circuit between first and second metal lines 18a, 18b. As used herein first and second metal lines 18a & 18b can be adjacent metal lines and vice versa. Such a discontinuous barrier layer 22a, 22b can be formed using a chemical vapor deposition process with or without etching in some embodiments, and any suitable process in other embodiments. Suitable processes for depositing the barrier layer 22 include, but are not limited to, chemical vapor deposition (CVD) technique or a physical vapor deposition (PVD) technique with or without masking techniques (such as lithography). Examples of CVD and PVD techniques include, but are not limited to, atmospheric pressure chemical vapor deposition (APCVD), atomic layer deposition (ALD), plasma enhanced chemical vapor deposition (PECVD), metal organic chemical vapor deposition (MOCVD), and sputtering. FIG. 7A is a top view of the structure of FIG. 7. A length L of the first metal line 18a is greater than a width W of the first metal line 18a.

The barrier layer 22a, 22b can be formed by (i) selectively depositing barrier materials so that the barrier layer 22a, 22b is not deposited over the substrate 10 between adjacent metal lines 18a & 18b; (ii) etching the barrier layer 22a, 22b to remove barrier material deposited between adjacent metal lines 18a & 18b; or (iii) both. As shown in FIG. 7, if the barrier layer 22a, 22b is conductive, there is no continuous barrier layer 22a, 22b deposited over or on the substrate 10 connecting adjacent metal lines 18a, 18b, between adjacent seed materials 16a & 16b, or both. For example, a conductive barrier layer 22a, 22b can include a material such as, but not limited to, Co, CoO, CoN, Ta, TaN, TaO, Ru, RuO, RuN, Mn, MnO, MnN, Ti, Tin, W, WO.

In other embodiments, such as that shown in FIG. 6, the barrier layer 22a, 22b comprises a dielectric material. Such a non-conductive material can be present between adjacent metal lines 18a, 18b, between adjacent seed materials 16a & 16b, or both, without resulting in short circuits between adjacent lines. When the barrier layer 22a, 22b is a dielectric barrier layer, the barrier layer 22a, 22b can be formed of a low-κ material or an extreme low-κ material. For example, the barrier layer 22a, 22b can include a material such as, but not limited to, $Al_xO_y$, $Al_xN_y$, SiC, $SiO_xN_y$, and combinations thereof.

In some embodiments, following deposition of the metal lines 18, a dielectric layer 20 is deposited between and over adjacent metal lines 18a & 18b. FIG. 8 shows a cross-sectional view of the structure of FIG. 6 after a dielectric layer 20 is deposited between and over adjacent metal lines 18a & 18b.

In some embodiments, the method includes planarizing the interconnect layer 14 as shown in FIG. 8. The planarizing step can be accomplished by chemical mechanical polishing in some embodiments and other suitable techniques in other embodiments. In some embodiments, the planarizing step 110 can include planarizing the dielectric layer 20 without planarizing the barrier layer 22 or the metal line 18. In other embodiments, such as where the interconnect layer 14 is planarized to the planarization level 26, the planarizing step 110 can include planarizing the dielectric layer, the barrier layer 22, and the metal line 18.

In some embodiments, the dielectric layer 20 extends above the metal line 18 and the barrier layer 22. As shown in FIGS. 9 & 10, in such embodiments, the method can further include forming a via 28 extending from an upper surface 30 of the interconnect layer 14 to the metal line 18. The via 28 can be formed by selectively etching a vertical channel 32 in the dielectric layer 20, as shown in FIG. 9, followed by filling the channel 32 with a conductive material 34 to form the via 28 as shown in FIG. 10. Following bulk fill of the via 28, the interconnect layer 14 can be planarized. The metal line 18 and the via 28 can be electrically coupled to one another. In some embodiments, the majority of the via 28 is formed by the metal line 18, so that high aspect-ratio structures are not formed during this step and the via 28 can be formed using techniques, such as single-damascene techniques.

Figure 11:
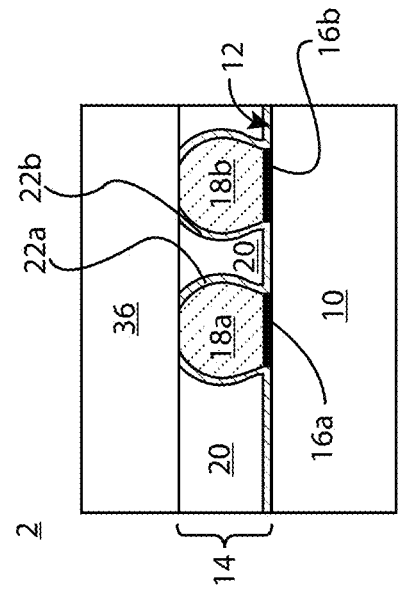
FIG. 11 is a cross-sectional view of the intermediate structure of FIG. 10 following formation of additional structure over the interconnect layer in accordance with some embodiments.
Figure 12:
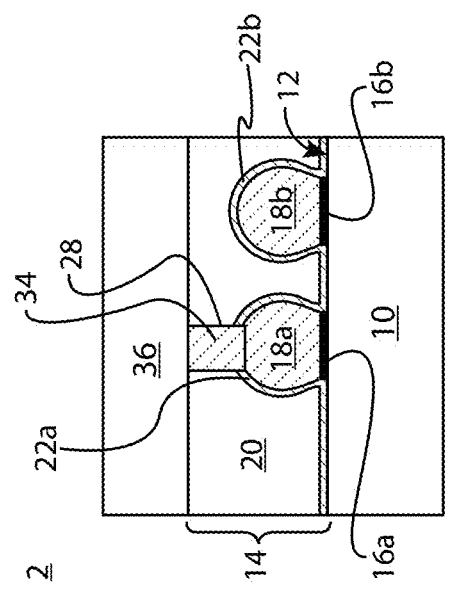
FIG. 12 is a cross-sectional view of the intermediate structure of FIG. 8 following planarization and formation of additional structure over an interconnect layer in accordance with some embodiments.

In some embodiments, the process can also include depositing additional structures 36 over the interconnect layer 14. FIG. 11 shows an embodiment where additional structures 36 are deposited over the interconnect layer 14 following deposition of a second metal line 38 as part of a via 28. FIG. 12 shows an embodiment where additional structures 36 are deposited over the interconnect layer 14 following planarization down to the metal line 18 (i.e., the planarization level 26 of FIG. 8). As seen in FIG. 12, the first metal line 16a, the second metal line 16b, or both 16a, 16b can have substantially flat top surfaces.

As shown in FIGS. 11 & 12, the additional structures 36 can be electrically coupled to the substrate 10 by the metal line 18 and, optionally, second metal line 34. The additional structures 36 can be conductive lines, vias, capacitors, inductors, bonding pads, dummy patterns, or any other structure suitable for inclusion in the interconnect layers of an integrated circuit.

Figure 13:
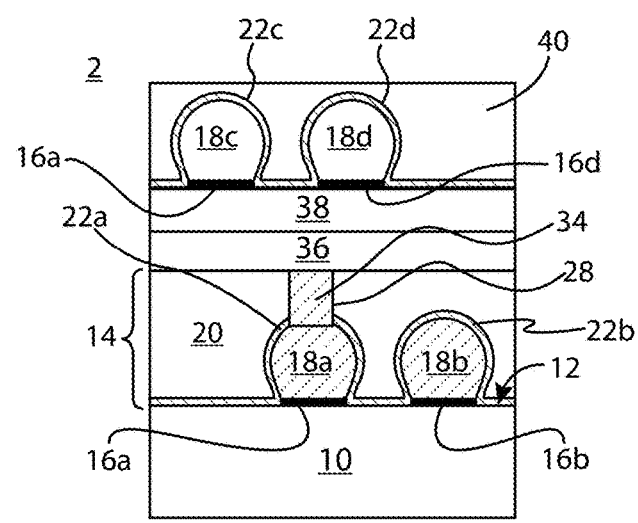
FIG. 13 is a cross-section view of the structure of FIG. 11 following deposition of an interlayer and a second interconnect layer.

FIG. 13 shows the structure of FIG. 11 where an interlayer 38 has been deposited over the additional structure 36. In addition a second seed layer with third and fourth features 16c, 16d has been deposited over the interlayer 38. Third and fourth metal lines 18c, 18d have been deposited on the third and fourth features 16c, 16d. Third and fourth barrier layers 22c, 22d have been deposited on the third and fourth metal lines 18c, 18d. Finally, a dielectric material 40 has been deposited between the third and fourth metal lines 18c, 18d. All aspects of the first and second metal lines 18a, 18b, including their formation, properties, compositions and the components surrounding them can be applied to the third and fourth metal lines 18c, 18d.

The width of at least one metal line can be at least five times a height of the metal line in one embodiment, and the width of all metal lines can be at least five times a height in other embodiments. In still other embodiments, the width of the metal line or lines can be <1H, or can range from 1H to 2H, or can range from 2H to 3H, or can range from 3H to 4H, or can range from 4H to 5H, or any combination thereof (e.g., <2H or >3H or range from 1 to 5H).

Figure 14:
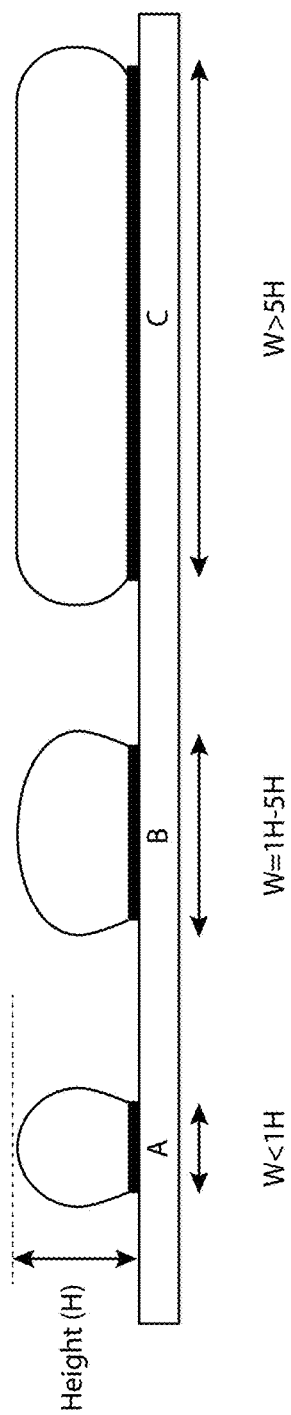
FIG. 14 is a cross-sectional views of metal lines of varying widths in accordance with some embodiments.

FIG. 14 shows a cross-sectional view of the width (W) and height (H) of metal lines 18 with various widths. As can be seen, the widest metal line (FIG. 14C) has a substantially flat top, while the narrower metal lines of FIGS. 14A and 14B have rounded tops. In some embodiments, a substantially flat top is provided for depositing subsequent layers in the formation of a semiconductor structure.

Semiconductor structures 2 such as those shown in FIGS. 11 and 12 are now described. The semiconductor structures 2 can include a substrate 10 having an upper surface 12; and an interconnect layer 14 over the upper surface 12. The interconnect layer 14 can include a patterned seed layer 16 over the substrate 12, at least two metal lines 18 over the seed layer 16, and a dielectric material 20 between adjacent metal lines 18a & 18b.

A barrier layer 22 can surround lateral portions of the metal line 18, upper portions or the metal line 18, or both. The dielectric layer 20 can be formed of an extreme low-κ dielectric material or a low-κ dielectric material in some embodiments, and any other suitable dielectric material in other embodiments. The metal line 18 can include a metal (e.g., copper) and the barrier layer 22 can be a barrier to migration (e.g., diffusion) of the metal (e.g., copper). Additional structures 36 can be deposited over the interconnect layer 14. FIG. 11 shows an embodiment where additional structures 36 are deposited over the interconnect layer 14 following deposition of a second metal line 38 as part of a via 28. FIG. 12 shows an embodiment where additional structures 36 are deposited over the interconnect layer 14 following planarization down to the metal line 18 (i.e., the planarization level 26 of FIG. 8).

One of the broader forms of the present disclosure involves a semiconductor structure. The semiconductor substructure can include a substrate having an upper surface; and an interconnect layer over the upper surface. The interconnect layer can include a patterned seed layer having a first feature and a second feature over the substrate. A first metal line can be over the first feature and a second metal line can be over the second feature. A dielectric material can be disposed between the first metal line and the second metal line. The first metal line has a rounded top surface.

In some embodiments, a width of the first metal line is less than five times a height of the first metal line.

In some embodiments, the second metal line has a substantially flat top surface.

In some embodiments, a width of the second metal line is at least five times a height of the second metal line.

In some embodiments, the seed layer can include an element selected from the group consisting of Cu, Ru, Co, Al, Fe, Mn, Zn, W, Sn, Ag Au, Pt, Ta, Ti, and combinations thereof.

In some embodiments, a width of the first metal line, the second metal line or both, is at least five times the height of the metal line.

In some embodiments, the semiconductor structure can also include a barrier layer over the at least two metal lines.

In some embodiments, the barrier layer is not continuous between adjacent metal lines.

In some embodiments, the barrier layer is not conductive.

In some embodiments, an additional structure is deposited over the interconnect layer.

In some embodiments, the semiconductor structure further comprises a via connecting the first metal line to the additional structure.

Another of the broader forms of the present disclosure involves a method of forming a metal interconnect or via. The method can include providing a substrate having an upper surface; and forming an interconnect layer over the upper surface. Forming the interconnect layer can include forming a patterned seed layer having a first feature and a second feature over the upper surface; selectively depositing a first metal line over the first feature and a second metal line over the second features; and depositing a dielectric layer between adjacent metal lines. The first and second metal lines can be deposited by a method that comprises chemical direct plating.

In some embodiments, the method of forming the interconnect layer also includes forming a barrier layer around the first and second metal lines prior to depositing the dielectric layer.

In some embodiments, the barrier layer is formed using a chemical vapor deposition process.

In some embodiments, forming the barrier layer includes selectively depositing barrier materials so that the barrier layer is not deposited over the substrate between the first and second metal lines.

In some embodiments, forming the barrier layer includes etching the barrier layer to remove barrier material deposited between the first and second metal lines.

In some embodiments, forming the interconnect layer further comprises planarizing the dielectric layer.

In some embodiments, at least a portion of the first metal line, the second metal line, or both are planarized during the planarizing.

In some embodiments, the dielectric layer extends above the metal lines, and forming the interconnect layer also includes selectively etching a channel in the dielectric layer, and filling the channel with a conductive material, where the metal line and the conductive material are in electrical communication with one another.

In some embodiments, the method also includes electrically coupling one or more metal lines of the interconnect layer with additional structures.

In some embodiments, the substrate is a structured substrate.

In some embodiments, the method includes selectively depositing the metal line over the seed layer using chemical direct plating.

In some embodiments, the width of at least one metal line is at least five times a height of the metal line.

In some embodiments, the method also includes depositing additional metal lines over the interconnect layer. The additional metal lines can be deposited by a method that includes forming a second patterned seed layer having a third feature and a fourth feature over the interconnect layer, and selectively depositing a third metal line over the third feature and a fourth metal line over the fourth feature. The third and fourth metal lines can be are deposited by a method that comprises chemical direct plating Still another of the broader forms of the present disclosure involves a method for forming a metal interconnect or via. The method can include providing a substrate having an upper surface; forming an interconnect layer over the upper surface, and forming additional structures over the interconnect layer. Forming the interconnect layer can include forming a patterned seed layer over the upper surface, selectively depositing at least two metal lines over the seed layer, forming a barrier layer around the metal line, and depositing a dielectric layer between adjacent metal lines. One or more of the metal lines can be in electrical communication with the additional structures.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A semiconductor structure comprising:
   a substrate having a planar upper surface; and
   an interconnect layer over the planar upper surface,
      wherein the interconnect layer comprises:

a patterned seed layer having a first feature and a second feature, wherein said patterned seed layer is located entirely over the planar upper surface, a first metal line over the first feature, wherein the first metal line has a planar bottom surface extending between opposing sides of the first metal line, and a length of the first metal line is greater than a width of the first metal line, a second metal line over the second feature, a conductive barrier layer on the at least two metal lines, and a dielectric material disposed between the first metal line and the second metal line, wherein the first metal line has a rounded top surface, including opposing rounded sides that intersect opposite edges of the planar bottom surface.

2. The semiconductor structure of claim 1, wherein a width of the first metal line is less than five times a height of the first metal line.

3. The semiconductor structure of claim 1, wherein the second metal line has a substantially flat top surface.

4. The semiconductor structure as in claim 1, wherein the patterned seed layer comprises an element selected from the group consisting of Cu, Ru, Co, Al, Fe, Mn, Zn, W, Sn, Ag Au, Pt, Ta, Ti, or combinations thereof.

5. The semiconductor structure as in claim 1, wherein the barrier layer is not continuous between adjacent metal lines.

6. The semiconductor structure as in claim 1, wherein the barrier layer is a metal.

7. The semiconductor structure as in claim 1, further comprising an additional structure over the interconnect layer.

8. The semiconductor structure as in claim 7, further comprising a via connecting the first metal line to the additional structure.

9. The semiconductor structure as in claim 1, wherein the second metal line has a planar bottom surface extending between opposing sides of the second metal line.

10. The semiconductor structure as in claim 9, wherein the bottom surface of the second metal line is parallel to the planar upper surface of the substrate.

11. The semiconductor structure as in claim 10, wherein each of the bottom surface of the first metal line and the bottom surface of the second metal line are parallel to the planar upper surface of the substrate and to each other.

12. The semiconductor structure as in claim 11, wherein the patterned seed layer is on the planar upper surface and the first and second metal lines are on the patterned seed layer.

13. The semiconductor structure as in claim 1, wherein a length of the second metal line is greater than a width of the second metal line.

14. The semiconductor structure as in claim 13, wherein the opposing sides of the first metal line are convex and the opposing sides of the second metal line are convex.

15. The semiconductor structure as in claim 1, wherein the opposing sides of the first metal line are convex.

16. The semiconductor structure as in claim 1, wherein the bottom surface of the first metal line is parallel to the planar upper surface of the substrate.

17. The semiconductor structure as in claim 8, further comprising a second via connecting the second metal line to the additional structure.

18. The semiconductor structure as in claim 1, wherein the barrier layer includes a material from the group consisting of Co, CoO, CoN, Ta, TaN, TaO, Ru, RuO, RuN, Mn, MnO, MnN, Ti, TiN, W, or WO.

19. A semiconductor structure comprising:

a substrate having a planar upper surface; and an interconnect layer over the planar upper surface, wherein the interconnect layer comprises:

a patterned seed layer having a first feature and a second feature, wherein said patterned seed layer is located entirely over the planar upper surface, a first metal line over the first feature, wherein the first metal line has a planar bottom surface extending between opposing sides of the first metal line, a second metal line over the second feature, wherein a width of the second metal line is at least five times a height of the second metal line;

a conductive barrier layer on the at least two metal lines, and a dielectric material disposed between the first metal line and the second metal line, wherein the first metal line has a rounded top surface, including opposing rounded sides that intersect opposite edges of the planar bottom surface.

* * * * *